(12) United States Patent
Xiang

(10) Patent No.: US 12,394,762 B2
(45) Date of Patent: Aug. 19, 2025

(54) LIGHT-EMITTING DIODES BASED DISPLAY PANEL INCLUDING LIGHT-SHIELDING LAYERS WITH A PLURALITY OF OPENINGS AND MANUFACTURING METHODS FOR THE DISPLAY PANEL

(71) Applicant: TCL CHINA STAR OPTOELECTRONICS TECHNOLOGY CO., LTD., Guangdong (CN)

(72) Inventor: Changming Xiang, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 457 days.

(21) Appl. No.: 17/795,555

(22) PCT Filed: Jul. 18, 2022

(86) PCT No.: PCT/CN2022/106183
§ 371 (c)(1),
(2) Date: Jul. 27, 2022

(87) PCT Pub. No.: WO2023/236315
PCT Pub. Date: Dec. 14, 2023

(65) Prior Publication Data
US 2023/0402433 A1    Dec. 14, 2023

(30) Foreign Application Priority Data
Jun. 8, 2022    (CN) .......................... 202210643135.4

(51) Int. Cl.
*H01L 25/075*    (2006.01)
(52) U.S. Cl.
CPC ............................... *H01L 25/0753* (2013.01)

(58) Field of Classification Search
CPC . H01L 25/0753; H01L 33/483; H10H 20/855; H10H 20/0363; G02B 3/0056
See application file for complete search history.

(56) References Cited

U.S. PATENT DOCUMENTS

2016/0370574 A1* 12/2016 Cho ....................... G02B 30/24
2018/0143490 A1    5/2018 Wakabayashi
(Continued)

FOREIGN PATENT DOCUMENTS

| CN | 109445161 A | 3/2019 |
|---|---|---|
| CN | 110416247 A | 11/2019 |

(Continued)

OTHER PUBLICATIONS

International Search Report in International application No. PCT/CN2022/106183, mailed on Dec. 16, 2022.
(Continued)

*Primary Examiner* — Changhyun Yi
(74) *Attorney, Agent, or Firm* — Rivka Friedman

(57) ABSTRACT

The present disclosure discloses a display panel and a manufacturing method for display panel. The display panel includes a cover plate disposed on a side of each of the plurality of light-emitting diodes away from the substrate, wherein the cover plate includes a main body, a first light-shielding layer disposed on a side of the main body close to the substrate, and a second light-shielding layer disposed on a side of the main body away from the substrate; wherein the first light-shielding layer includes a plurality of first openings, the second light-shielding layer includes a plurality of second openings; wherein the plurality of first openings are disposed corresponding to the plurality of light-emitting diodes, respectively, and the plurality of second openings are disposed corresponding to the plurality of light-emitting diodes, respectively.

16 Claims, 9 Drawing Sheets

(56) References Cited

U.S. PATENT DOCUMENTS

2022/0320386 A1\* 10/2022 Sun .................... G02B 3/0043
2023/0056073 A1\* 2/2023 Hirosawa ................ H01L 33/58

FOREIGN PATENT DOCUMENTS

| CN | 110426888 A | 11/2019 |
| CN | 112164705 A | 1/2021 |
| CN | 112768471 A | 5/2021 |
| CN | 114284314 A | 4/2022 |
| CN | 114582915 A | 6/2022 |
| KR | 20180001022 A | 1/2018 |

OTHER PUBLICATIONS

Written Opinion of the International Search Authority in International application No. PCT/CN2022/106183, mailed on Dec. 16, 2022.
Chinese Office Action issued in corresponding Chinese Patent Application No. 202210643135.4 dated May 9, 2025, pp. 1-10.

\* cited by examiner

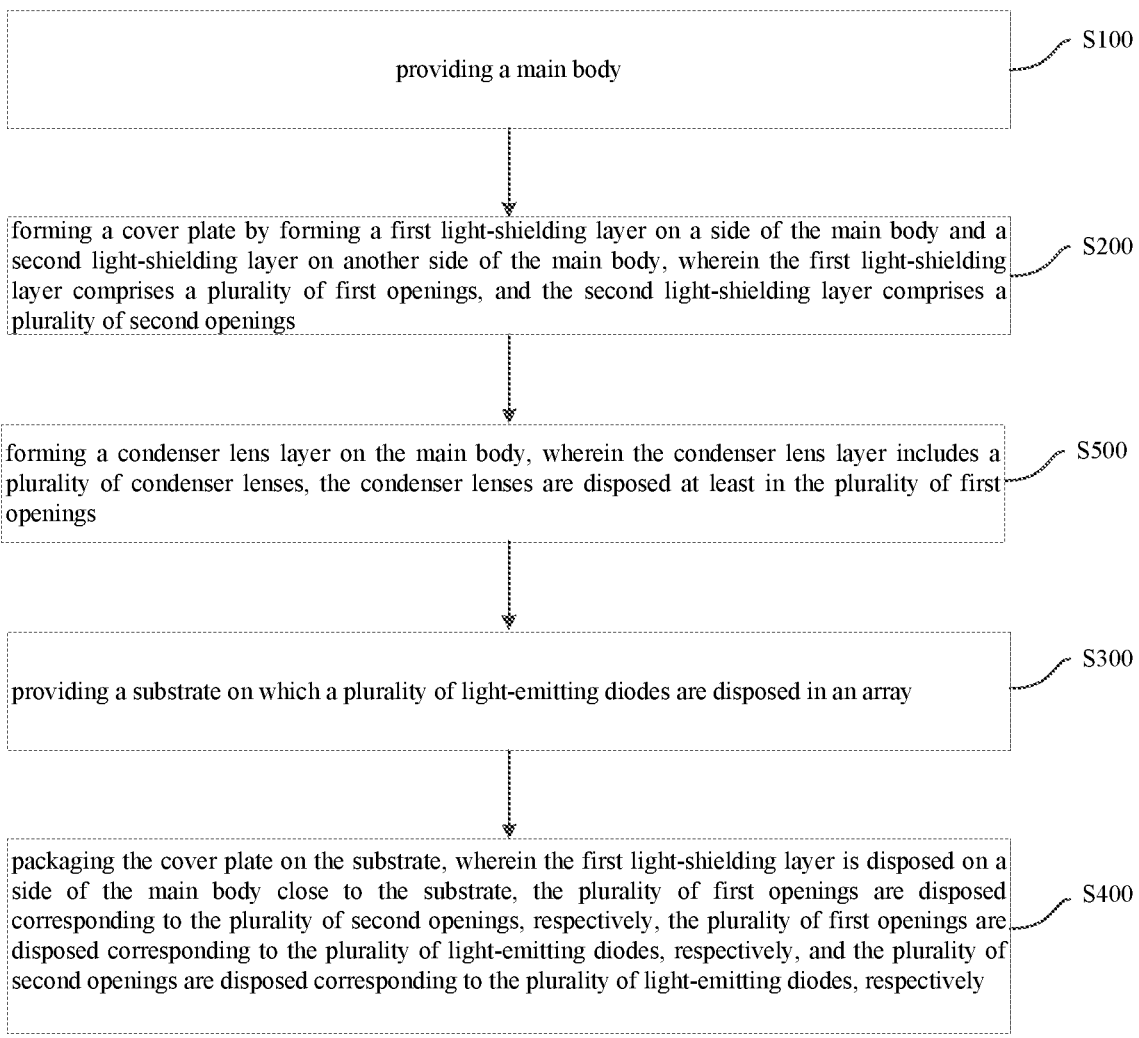

LIGHT-EMITTING DIODES BASED DISPLAY PANEL INCLUDING LIGHT-SHIELDING LAYERS WITH A PLURALITY OF OPENINGS AND MANUFACTURING METHODS FOR THE DISPLAY PANEL

TECHNICAL FIELD

The present disclosure relates to a display field, and in particular, to a display panel and a manufacturing method for the display panel.

BACKGROUND

With development of semiconductor technology, light-emitting diode (LED) manufacturing technology is becoming more and more mature, and light-emitting diode display panel becomes a development trend of future display. At present, panel manufacturers are increasing investment in light-emitting diode display panel.

However, light crosstalk between adjacent light-emitting diodes occurs in a light-emitting diode display panel. For example, lights emitted by the red light-emitting diodes partially toward emitting areas corresponding to adjacent green light-emitting diodes or blue light-emitting diodes, resulting in the light crosstalk between adjacent light-emitting diodes and causing color deviation and contrast reduction.

Technical Problems

The present disclosure provides a display panel and a manufacturing method for display panel, which can solve a problem of light crosstalk between adjacent light-emitting diodes in a light-emitting diode display panel, and a problem of color shift and contrast reduction.

SUMMARY

Embodiments of the present disclosure provide a display panel including:
a substrate;
a plurality of light-emitting diodes disposed on the substrate in an array; and
a cover plate disposed on a side of each of the plurality of light-emitting diodes away from the substrate;
wherein the cover plate comprises a main body, a first light-shielding layer disposed on a side of the main body close to the substrate, and a second light-shielding layer disposed on a side of the main body away from the substrate; wherein the first light-shielding layer includes a plurality of first openings, the second light-shielding layer includes a plurality of second openings; wherein the plurality of first openings are disposed corresponding to the plurality of second openings, respectively, the plurality of first openings are disposed corresponding to the plurality of light-emitting diodes, respectively, and the plurality of second openings are disposed corresponding to the plurality of light-emitting diodes, respectively.

Optionally, in some embodiments of the present disclosure, the cover plate further includes:
a condenser lens layer disposed on the side of the main body close to the substrate, wherein the condenser lens layer comprises a plurality of condenser lenses disposed at least in the plurality of first openings, and the plurality of condenser lenses are opposite to the plurality of light-emitting diodes.

Optionally, in some embodiments of the present disclosure, the condenser lens layer further comprises a plurality of lens connectors disposed on the main body, each of the plurality of lens connectors connects adjacent condenser lenses of the plurality of condenser lenses, and a height of each of the plurality of condenser lenses from the main body is greater than a height of the lens connector from the main body.

Optionally, in some embodiments of the present disclosure, the condenser lens and the lens connector are integrally formed.

Optionally, in some embodiments of the present disclosure, the first light-shielding layer is disposed on a surface of the lens connector close to the substrate and between the adjacent condenser lenses.

Optionally, in some embodiments of the present disclosure, the first light-shielding layer is disposed on a surface of the lens connector away from the substrate.

Optionally, in some embodiments of the present disclosure, the cover plate further comprises a first film layer which is made of a hydrophobic material, the first film layer is disposed on a surface of the first light-shielding layer close to the substrate, wherein the first film layer comprises a plurality of fourth openings corresponding to the plurality of first openings, respectively, an orthographic projection of the first film layer on the main body covers an orthographic projection of the first light-shielding layer on the main body, and the plurality of condenser lens are disposed in the plurality of fourth openings.

Optionally, in some embodiments of the present disclosure, the cover plate further includes:
a first protective layer disposed on a side of the main body away from the substrate, wherein the first protective layer covers a surface of the second light-shielding layer away from the substrate.

Optionally, in some embodiments of the present disclosure, the display panel further includes a support post disposed between the cover plate and the substrate.

Optionally, in some embodiments of the present disclosure, the display panel further includes a support post disposed between the cover plate and the substrate, and the condenser lens layer and the support post are integrally formed.

Optionally, in some embodiments of the present disclosure, an orthographic projection of each of the plurality of first openings on the substrate overlaps with an orthographic projection of a respective one of the plurality of second openings on the substrate.

Accordingly, embodiments of the present disclosure further provide a manufacturing method for display panel, including:
providing a main body;
forming a cover plate by forming a first light-shielding layer on a side of the main body and a second light-shielding layer on another side of the main body, wherein the first light-shielding layer comprises a plurality of first openings, and the second light-shielding layer comprises a plurality of second openings;
providing a substrate on which a plurality of light-emitting diodes are disposed in an array; and
packaging the cover plate on the substrate, wherein the first light-shielding layer is disposed on a side of the main body close to the substrate, the plurality of first openings are disposed corresponding to the plurality of second openings, respectively, the plurality of first openings are disposed corresponding to the plurality of light-emitting diodes, respectively, and the plurality of second openings are disposed corresponding to the plurality of light-emitting diodes, respectively.

Optionally, in some embodiments of the present disclosure, before or after forming the first light-shielding layer on the side of the main body, forming a condenser lens layer on the main body, wherein the condenser lens layer includes a plurality of condenser lenses, the condenser lenses are disposed at least in the plurality of first openings; and the plurality of condenser lenses are opposite to the plurality of light-emitting diodes after packaging the cover plate on the substrate.

Optionally, in some embodiments of the present disclosure, the condenser lens layer further comprises a plurality of lens connectors disposed on the main body, each of the plurality of lens connectors connects adjacent condenser lenses of the plurality of condenser lenses, a height of each of the plurality of condenser lenses from the main body is greater than a height of the lens connector from the main body; and the condenser lens and the lens connector are formed by a same embossing process.

Beneficial Effects

According to embodiments of the present disclosure, a display panel and a manufacturing method for display panel are provided. the display panel includes a substrate; a plurality of light-emitting diodes disposed on the substrate in an array; and a cover plate disposed on sides of the plurality of light-emitting diodes away from the substrate. The cover plate includes a main body, a first light-shielding layer disposed on a side of the main body close to the substrate, and a second light-shielding layer disposed on a side of the main body away from the substrate. The first light-shielding layer includes a plurality of first openings, and the second light-shielding layer includes a plurality of second openings. The plurality of first openings are disposed corresponding to the plurality of second openings, respectively. The plurality of first openings are disposed corresponding to the plurality of light-emitting diodes, respectively; and the plurality of second openings are disposed corresponding to the plurality of light-emitting diodes, respectively. According to the embodiments of the present disclosure, a cover plate is used in a light-emitting diode display panel, and a light-shielding layer is provided on both sides of the main body opposite to each other. The first light-shielding layer and the second light-shielding layer can well block the crosstalk light between adjacent light-emitting diodes, thereby avoiding the occurrence of the crosstalk light, and solving the problem of color shift and contrast reduction.

BRIEF DESCRIPTION OF THE DRAWINGS

In order to more clearly describe technical solutions in embodiments of the present disclosure, accompanying drawings required in the description of the embodiments will be briefly described below. It is obvious that the accompanying drawings in the following description are merely related to some embodiments of the present disclosure, and other drawings may be obtained by those skilled in the art without creative efforts.

FIG. 9 is a third process diagram of a manufacturing method for display panel according to an embodiment of the present disclosure.

FIG. 10 is a schematic block diagram of another manufacturing method for display panel according to an embodiment of the present disclosure.

FIG. 11 is a first process diagram of a manufacturing method for display panel according to a third embodiment of the present disclosure.

DETAILED DESCRIPTION OF THE EMBODIMENTS

Technical solutions in embodiments of the present disclosure will be clearly and completely described below in conjunction with accompanying drawings in the embodiments of this disclosure. It is clear that described embodiments are only some but not all of the embodiments of the present disclosure. Based on the embodiments of the present disclosure, all other embodiments obtained by a person skilled in the art without creative efforts are within the scope of the present disclosure. In addition, it should be understood that the specific embodiments described herein are merely intended to illustrate and explain the present disclosure, and are not intended to limit the present disclosure. In the present disclosure, in the absence of a description to the contrary, the terms such as "upper" and "lower" generally refer to upper and lower sides of a device in actual use or working state, specifically according to a drawing direction in the accompanying drawings. Moreover, the terms "inside" and "outside" refer to an outline of a device.

A display panel is provided herein, wherein the display panel includes a substrate; a plurality of light-emitting diodes disposed on the substrate in an array; and a cover plate disposed on sides of the plurality of light-emitting diodes away from the substrate. The cover plate includes a main body, a first light-shielding layer disposed on a side of the main body close to the substrate, and a second light-shielding layer disposed on a side of the main body away from the substrate. The first light-shielding layer includes a plurality of first openings, and the second light-shielding layer includes a plurality of second openings. The plurality of first openings are disposed corresponding to the plurality of second openings, respectively. The plurality of first openings are disposed corresponding to the plurality of light-emitting diodes, respectively; and the plurality of second openings are disposed corresponding to the plurality of light-emitting diodes, respectively.

A manufacturing method for foregoing display panel is provided herein.

Embodiments of the present disclosure are described in detail below. It should be noted that an order of description of following embodiments is not limited as an preferred order of embodiments.

Embodiment 1

Figure 1:
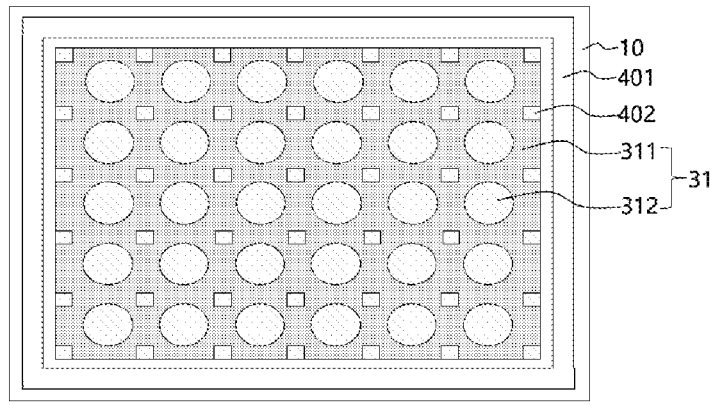
FIG. 1 is a schematic bottom view of a cover plate of a display panel according to an embodiment of the present disclosure.
Figure 2:
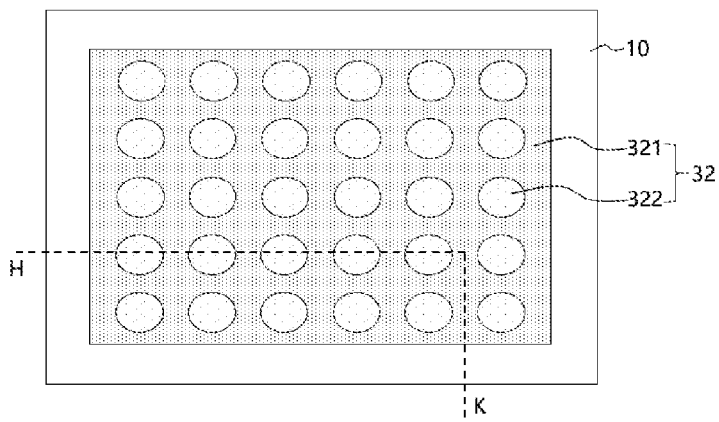
FIG. 2 is a schematic top view of a cover plate of a display panel according to an embodiment of the present disclosure.
Figure 3:
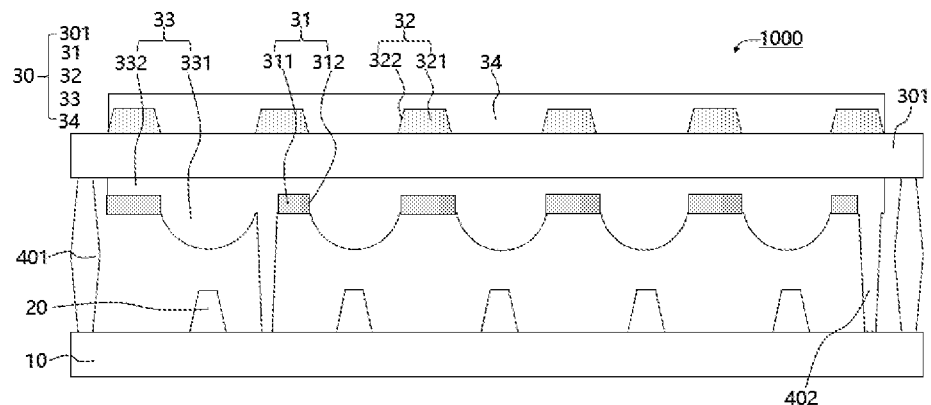
FIG. 3 is a schematic cross-sectional view of a first partial structure of a display panel according to an embodiment of the present disclosure.
Figure 4:
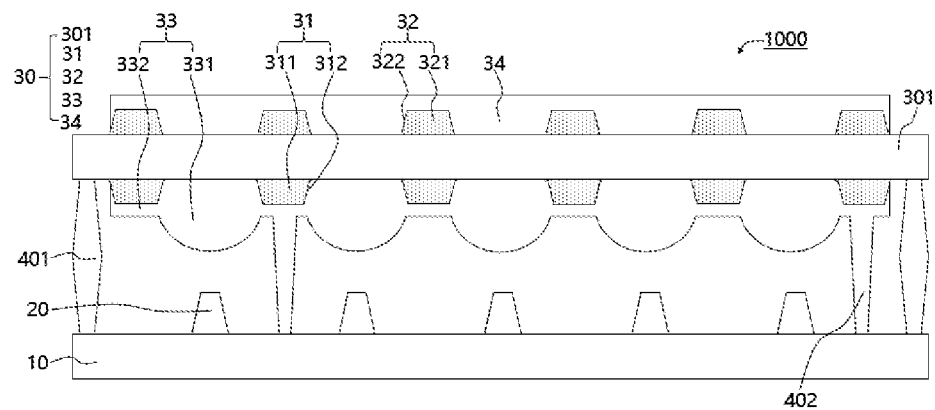
FIG. 4 is a schematic cross-sectional view of a second partial structure of a display panel according to an embodiment of the present disclosure.
Figure 5:
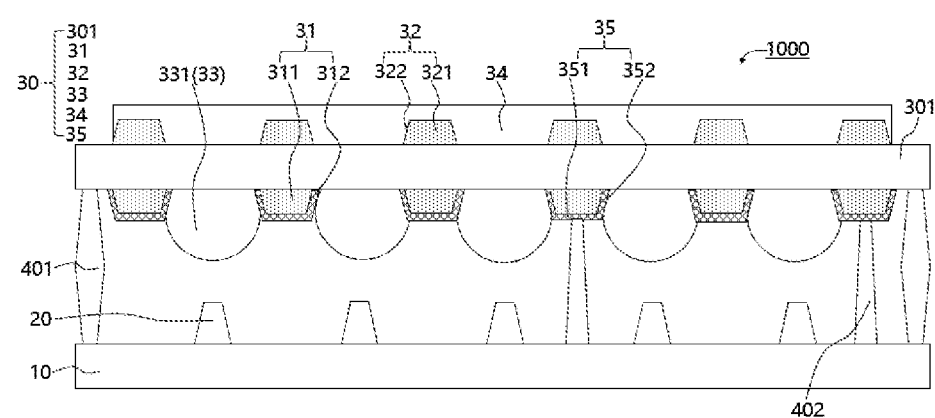
FIG. 5 is a schematic cross-sectional view of a third partial structure of a display panel according to an embodiment of the present disclosure.

FIG. 1 is a schematic bottom view of a cover plate of a display panel according to an embodiment of the present disclosure. FIG. 2 is a schematic top view of a cover plate of a display panel according to an embodiment of the present disclosure. FIG. 3 is a schematic cross-sectional view of a first partial structure of a display panel according to an embodiment of the present disclosure. FIG. 4 is a schematic cross-sectional view of a second partial structure of a display panel according to an embodiment of the present disclosure. FIG. 5 is a schematic cross-sectional view of a third partial structure of a display panel according to an embodiment of the present disclosure. FIG. 3, FIG. 4 and FIG. 5 are schematic cross-sectional views taken along a dotted line H-K in FIG. 2. In order to explain a cross-sectional structure of the cover plate more clearly and intuitively, position of a support post 402 is adjusted in FIG. 3, FIG. 4 and FIG. 5.

A display panel 1000 is provided in an embodiment of the present disclosure. The display panel 1000 includes a substrate 10, a plurality of light-emitting diodes 20, and a cover plate 30. The plurality of light-emitting diodes 20 are disposed on the substrate 10 in an array. A cover plate 30 is disposed on sides of the plurality of light-emitting diodes 20 away from the substrate 10. The cover plate includes a main body 301, a first light-shielding layer 31 disposed on the main body 301 and on a side of the main body 301 close to the substrate 10, and a second light-shielding layer 32 disposed on the main body 301 and on the side of the main body 301 away from the substrate 10. The first light-shielding layer 31 includes a plurality of first openings 312, and the second light-shielding layer 32 includes a plurality of second openings 322. The first openings 312 are disposed corresponding to the second openings 322, respectively. The first openings 312 are disposed corresponding to the light-emitting diodes 20, respectively; and the second openings 322 are disposed corresponding to the light-emitting diodes 20, respectively.

Specifically, the display panel 1000 includes a substrate 10, a plurality of light-emitting diodes 20, and a cover plate 30. The substrate 10 and the cover plate 30 are disposed oppositely, and the plurality of light-emitting diodes 20 are disposed between the substrate 10 and the cover plate 30. The plurality of light-emitting diodes 20 are disposed on the substrate 10 in an array optionally by welding or the like.

Specifically, the substrate 10 may include structures such as circuits, wirings, and the like for driving the plurality of light-emitting diodes 20. For example, the substrate 10 is an array substrate, and the substrate 10 may include a plurality of thin film transistors.

Specifically, the plurality of light-emitting diodes may be a plurality of micro light-emitting diodes (Micro-LED or MM-LED).

Specifically, the material of the main body 301 may be glass or the like, and is not limited herein.

Specifically, the cover plate includes a main body 301, a first light-shielding layer 31 disposed on the main body 301 and on a side of the main body 301 close to the substrate 10, and a second light-shielding layer 32 disposed on the main body 301 and on the side of the main body 301 away from the substrate 10. The first light-shielding layer 31 and the second light-shielding layer 32 are disposed on opposite sides of the main body 301.

Specifically, the material of the first light-shielding layer 31 and the second light-shielding layer 32 may be black resin, which is not limited herein. For example, both the first light-shielding layer 31 and the second light-shielding layer 32 are black matrixes, and the material of the first light-shielding layer 31 and the second light-shielding layer 32 may be black glue material.

Specifically, the first light-shielding layer includes a plurality of first openings 312. From the cross-sectional views, the first light-shielding layer includes a plurality of first openings 312 and a plurality of first light-shielding members 311. Two adjacent first light-shielding members 311 are disposed on two sides of a respective one of the first openings 312. FIG. 3, FIG. 4 and FIG. are schematic cross-sectional views taken along a dotted line H-K of in FIG. 2. In a bottom view, a top view, or a plan view, the plurality of first light-shielding members 311 or a part of the plurality of first light-shielding members 311 may be connected as a whole, and the plurality of second light-shielding members 321 or a part of the plurality of second light-shielding members 321 may be connected as a whole.

Specifically, the plurality of first openings 312 are disposed corresponding to the plurality of second openings 322, respectively. Each of the first openings 312 partially or completely overlaps with a respective one of the second openings 322 in a direction perpendicular to the main body 301. An orthographic projection of each of the first openings 312 on the substrate partially or completely overlaps an orthographic projection of the respective one of the second openings 322 on the substrate 10.

Specifically, the first openings 312 are disposed corresponding to the light-emitting diodes 20, respectively; and the second openings 322 are disposed corresponding to the light-emitting diodes 20, respectively. Each of the first openings 312 partially or completely overlaps with a respective one of the light-emitting diodes 20 in a direction perpendicular to the main body 301, and each of the second openings 322 partially or completely overlaps with a respective one of the light-emitting diodes 20 in a direction perpendicular to the main body 301. The orthographic projection of the first opening 312 on the substrate 10 and the orthographic projection the second opening 322 on the substrate 10 cover an orthographic projection of the respective light-emitting diode 20 on the substrate 10.

Specifically, the first openings 312 are disposed corresponding to the light-emitting diodes 20, respectively; and the second openings 322 are disposed corresponding to the light-emitting diodes 20, respectively. Orthographic projections of the first light-shielding members 311 on the substrate 10 and orthographic projections of the second light-shielding members 321 on the substrate 10 do not overlap with the orthographic projections of the light-emitting diodes 20 on the substrate 10. The first openings 312 and the second openings 322 serve as an exit for the lights emitted by the light-emitting diodes 20, and the light emitted by each light-emitting diode 20 passes through the first opening 312 and the second opening 322 corresponding thereto to reach the ambient and the human eye.

Specifically, the first openings 312 are disposed corresponding to the light-emitting diodes 20, respectively; and the second openings 322 are disposed corresponding to the light-emitting diodes 20, respectively. Each of the first openings 312 disposed correspondingly to a respective one of the second openings 322, and a respective one of the light-emitting diodes 20. The lights emitted by one light-emitting diode come out from the first opening 312 and the second opening 322 corresponding to the light-emitting diode. These lights are blocked or shielded from being reached to another light-emitting diodes by the first light-shielding member 311 of the first light-shielding layer 31 and the second light-shielding member 321 of the second light-shielding layer 32. As such, it prevents light crosstalk between adjacent light-emitting diodes.

In this embodiment, the cover plate is disposed in the light-emitting diode display panel, and the first light-shielding layer 31 and the second light-shielding layer 32 are disposed on two opposite sides of the main body. The first light-shielding layer 31 and the second light-shielding layer 32 can well block the crosstalk light between adjacent light-emitting diodes, thereby reducing a risk of the crosstalk and improving the color deviation. When a part of the light-emitting diodes is lit, the lights cannot be emitted from adjacent unlit light-emitting diodes, thereby improving the contrast.

In this embodiment, the cover plate is provided in the light-emitting diode display panel to improve the mechanical strength of the display panel 1000 and the resistance to water and oxygen.

In some embodiments, as shown in FIG. 3, FIG. 4, and FIG. 5, the cover plate 30 further includes a condenser lens layer 33 disposed on a side of the main body 301 close to the substrate 10. The condenser lens layer 33 includes a plurality of condenser lenses 331, the condenser lenses 331 are disposed at least in the first openings 312, and the condenser lenses 331 are opposite to the light-emitting diodes 20.

Specifically, the condenser lenses 331 are disposed opposite to the light-emitting diodes 20, and in some embodiments, the condenser lenses 331 are disposed separately from the light-emitting diodes 20, i.e., the condenser lenses 331 do not contact with the light-emitting diodes 20.

Specifically, each of the condenser lenses 331 is filled at least in the first opening 312 corresponding thereto, and the condenser lens 331 may fill the first opening 312 and protrude from the first opening 312 toward the substrate 10.

Specifically, in the embodiments of FIGS. 3 and 4, the condenser lens 331 is exemplified as a convex lens, and the shape and type of the condenser lens 331 are not limited herein as long as the condenser lens 331 can converge the lights emitted by the light-emitting diode corresponding thereto.

Specifically, the material of the condenser lens layer 33 may include at least one of polymethyl methacrylate (PMMA), polycarbonate (PC), and the like, and is not limited herein.

Specifically, by providing the condenser lens layer 33 or the condenser lens 331, the lights emitted by the light-emitting diode 20 corresponding thereto can be converged, thereby reducing output angles of the lights, and further reducing crosstalk of the lights between adjacent light-emitting diodes.

Specifically, by providing the condenser lens 331, the image displayed on the display panel 1000 may have less graininess. Further, the condenser lens 331 may adopt a free-form curved microstructure to homogenize the lights, thereby better reducing the graininess of the image displayed on the display panel 1000.

Embodiment 2

This embodiment is the same as or similar to Embodiment 1, except the features of the display panel 1000 described below. References are made in FIG. 3 and FIG. 4.

In some embodiments, as shown in FIGS. 3 and 4, the condenser lens layer 33 further includes a plurality of lens connectors 332 formed over the main body 301. Each of the lens connectors 332 connects adjacent condenser lenses 331 corresponding to adjacent first openings 312. A height of the condenser lens 331 from the main body 301 is greater than a height of the lens connector 332 from the main body 301.

Specifically, the lens connector 332 connects adjacent condenser lenses 331 corresponding to adjacent first openings 312, thus, increasing the contact area between the condenser lens layer 33 and the main body 301, preventing the condenser lens 331 from peeling off from the main body 301, and improving the bonding strength between the condenser lens 331 and the main body 301.

Specifically, the height of the condenser lens 331 from the main body 301 is greater than the height of the lens connector 332 from the main body 301 to prevent the lens connector 332 from blocking or interfering with the lights emitted by the corresponding light-emitting diode and converged by the condenser lens 331.

In some embodiments, as shown in FIGS. 3 and 4, the condenser lens 331 and the lens connector 332 are integrally formed.

Specifically, the condenser lens 331 and the lens connector 332 are integrally formed, for example, formed by the same embossing process to reduce the manufacturing process.

Embodiment 3

This embodiment is the same as or similar to Embodiment 2, except the features of the display panel 1000 described below. References are made in FIG. 3.

In some embodiments, as shown in FIG. 3, the first light-shielding layer 31 is disposed on a surface of the lens connector 332 close to the substrate 10 and between adjacent condenser lenses 331.

Specifically, in an embodiment, as shown in FIG. 3, the positional relationship between the first light-shielding layer 31 and the condenser lens layer 33 is illustrated. The first light-shielding layer 31 is disposed on the surface of the lens connector 332 close to the substrate 10. In this case, the condenser lens layer 33 is firstly disposed or manufactured on the main body 301, and then the first light-shielding layer 31 is disposed or manufactured on the condenser lens layer. The manufacturing process is simple and the production cost is low. The position between the adjacent condenser lenses 331 provides the accommodation space for the first light-shielding layer 31. The first light-shielding layer 31 can be formed by an ink jet printing process or the like, so that the manufacturing process of the first light-shielding layer 31 is also simple.

In the present embodiment, an implementation of the embodiment shown in FIG. 3 is provided. The first light-shielding layer 31 is provided on the surface of the lens connector 332 close to the substrate 10, and has the effect on a simple manufacturing process.

Embodiment 4

This embodiment is the same as or similar to Embodiment 2, except the features of the display panel 1000 described below. References are made in FIG. 4.

In some embodiments, the first light-shielding layer 31 is disposed on a surface of the lens connector 332 away from the substrate 10.

Specifically, the first light-shielding layer 31 is disposed on the surface of the lens connector 332 away from the substrate 10. The first light-shielding layer 31 is disposed on a surface of the main body 301 close to the substrate 10, and the lens connector 332 covers an surface of the first light-shielding layer 31 close the substrate 10.

Specifically, the first light-shielding layer 31 is disposed on a surface of the lens connector 332 away from the substrate 10, and the first light-shielding layer 31 is disposed between the lens connector 332 and the main body 301.

Specifically, in an embodiment, as shown in FIG. 4, the positional relationship between the first light-shielding layer 31 and the condenser lens layer 33 is illustrated. The lens connector 332 covers one side surface of the first light-shielding layer 31 close to the substrate. In this case, the first light-shielding layer 31 is first provided or manufactured on the main body 301, and then the condenser lens layer 33 is provided or manufactured on the first light-shielding layer 31. This manufacturing process is simple and the production cost is low.

Specifically, the lens connector 332 covers a surface of the first light-shielding layer 31 close to the substrate 10. A height of the lens connector 332 from the main body 301 is greater than a height of the first light-shielding layer 31 from the main body 301. The lens connector 332 can protect the first light-shielding layer 31 from peeling off from the main body 301.

In the present embodiment, an implementation of the embodiment shown in FIG. 4 is provided. The lens connector 332 covers the surface of the first light-shielding layer 31 close to the substrate 10, so that the lens connector 332 can protect the first light-shielding layer 31 and prevent the first light-shielding layer 31 from peeling off from the main body 301.

Embodiment 5

This embodiment is the same as or similar to Embodiment 1, except the features of the display panel 1000 described below. References are made in FIG. 5.

In some embodiments, as shown in FIG. 5, the cover plate 30 further includes a first film layer 35 which is made of a hydrophobic material. The first film layer 35 is disposed a surface of the first light-shielding layer 31 close to the substrate. The first film layer 35 includes a plurality of fourth openings 352 respectively corresponding to the plurality of first openings 312. The orthographic projection of the first film layer 35 on the main body 301 covers the orthographic projection of the first light-shielding layer 31 on the main body 301, and the condenser lens 331 is filled in the corresponding fourth opening 352.

Specifically, the first film layer 35 is disposed on the surface of the first light-shielding layer 31 close to the substrate 10, that is, the first film layer 35 covers the surface of the first light-shielding layer 31 close to the substrate 10.

Specifically, the first film layer 351 includes a plurality of first film layer members 351 and a plurality of fourth openings 352, wherein the first film layer members 351 cover the surfaces of the first light-shielding members 311 close to the substrate 10, respectively. Each of the first film layer members 351 also covers the side walls of a respective one of the first light-shielding members 311.

Specifically, the cover plate 30 further includes a first film layer 35 which is made of a hydrophobic material. The material of the first film layer 35 may include poly tetra fluoroethylene (PTFE, also referred as Teflon), and other hydrophobic material.

Specifically, the first film layer 35 includes a plurality of fourth openings 352 corresponding to the plurality of first openings 312. The orthographic projection of the first film layer 35 on the main body 301 covers the orthographic projection of the first light-shielding layer 31 on the main body 301. The first film layer 35 covers the first light-shielding members 311 of the first light-shielding layer 31, instead covering the first openings 312 of the first light-shielding layer 31.

Specifically, the first film layer 35 covers the side walls of the first light-shielding members 311 at the portion of the first opening 312.

Specifically, the plurality of fourth openings 352 correspond to the plurality of first openings 312, respectively. Each of the fourth openings 352 may be substantially overlapped with the respective one of the fourth openings 352.

Specifically, the condenser lens 331 is further provided to fill the fourth opening 352. This is, the condenser lens 331 is provided to fill the first opening 312 and the fourth opening 352.

Specifically, the first light-shielding layer 31 is disposed on the surface of the main body 301 close to the substrate 10, and the first film layer 35 covers the surface of the first light-shielding layer 31 close to the substrate 10.

In this embodiment, the display panel 1000 has a structure obtained from the following. Firstly, the first light-shielding layer 31 is formed or manufactured on the main body 301, then the first film layer 35 is formed or manufactured on the first light-shielding layer 31, and then the condenser lens 331 is formed in the first opening 312 and the fourth opening 352. The condenser lens 331 may be formed by ink jet printing. The first film layer 35 is made of a hydrophobic material, and the first film layer 35 covers the side walls of the first light-shielding members 331. The condenser lens 331 is in contact with the first film layer 35. Since the polarity of the first film layer 35 is opposite to the polarity of the material of the condenser lens 331, the material of the condenser lens 331 helps to form the condenser lens 331 having a structure such as a convex sphere or the like.

Embodiment 6

This embodiment is the same as or similar to the above embodiment, except the features the display panel 1000 described below.

In some embodiments, the cover plate 30 further includes a first protective layer 34 disposed on a side of the main body 301 away from the substrate 10, and the first protective layer 34 covers a surface of the second light-shielding layer 32 away from the substrate 10.

Specifically, the first protective layer 34 covers the surface of the second light-shielding layer 32 away from the substrate 10, and a height of the first protective layer 34 from the main body is greater than a height of the second light-shielding layer 32 from the main body.

Specifically, the first protective layer 34 covers on the second light-shielding layer 32, thereby serving to protect the second light-shielding layer 32, preventing the second light-shielding layer 32 from peeling off from the main body 301, and preventing an external object from scratching or hitting the second light-shielding layer 32.

Specifically, the material of the first protective layer 34 may include polyimide (PI), silica gel, and the like.

In some embodiments, the display panel 1000 further includes a support post 402 disposed between the cover plate 30 and the substrate 10.

Specifically, the support post 402 supports the cover plate 30 and the base plate 10 to maintain a predetermined distance between the support cover plate 30 and the base plate 10.

Specifically, the support post 402 supports the cover plate 30 and the substrate 10 to keep the condenser lens 331 separated from or uncontacted with the light-emitting diode 20, thereby improving the light convergence effect of the condenser lens 331.

In some embodiments, as shown in FIGS. 3 and 4, the display panel 1000 further includes a support post 402 disposed between the cover plate 30 and the substrate 10, and the condenser lens layer 33 and the support post 402 are integrally formed.

Specifically, in the embodiment shown in FIG. 3 or Embodiment 3, and in the embodiment shown in FIG. 4 or Embodiment 4, the condenser lens layer 33 and the support post 402 may be integrally formed. For example, the condenser lens layer 33 and the support post 402 are formed by the same embossing process, thereby simplifying the manufacturing process. The embossing process may be a die embossing process or a hot embossing process.

Specifically, in the embodiment shown in FIG. 3 or Embodiment 3, at the area of the lens connector 332 corresponding to the support post 402, the first light-shielding member 311 is disposed parallel to the support post 402, or no first light-shielding member 311 is provided.

In some embodiments, the orthographic projection of the first opening 312 on the substrate 10 overlaps with the orthographic projection of the corresponding second opening 322 on the substrate 10.

Specifically, the first opening 312 and the second opening 322 function to transmit the lights emitted by the corresponding light-emitting diodes. The first light-shielding member 311 of the first light-shielding layer 31 and the second light-shielding member 321 of the second light-shielding layer 32 function to block the lights emitted from adjacent light-emitting diodes. The orthographic projection of the first opening 312 on the substrate 10 overlaps with the orthographic projection of the corresponding second opening 322 on the substrate 10. Thus, the light-shielding effect of the first light-shielding member 311 of the first light-shielding layer 31 and the second light-shielding member 321 of the corresponding second light-shielding layer 32 is more sufficient, and the light transmission efficiency of the first opening 312 and the corresponding second opening 322 is greater, thereby preventing the light-shielding effect and the light transmission effect from being reduced due to the misalignment of the first light-shielding layer 31 and the second light-shielding layer 32.

Embodiment 7

Figure 6:
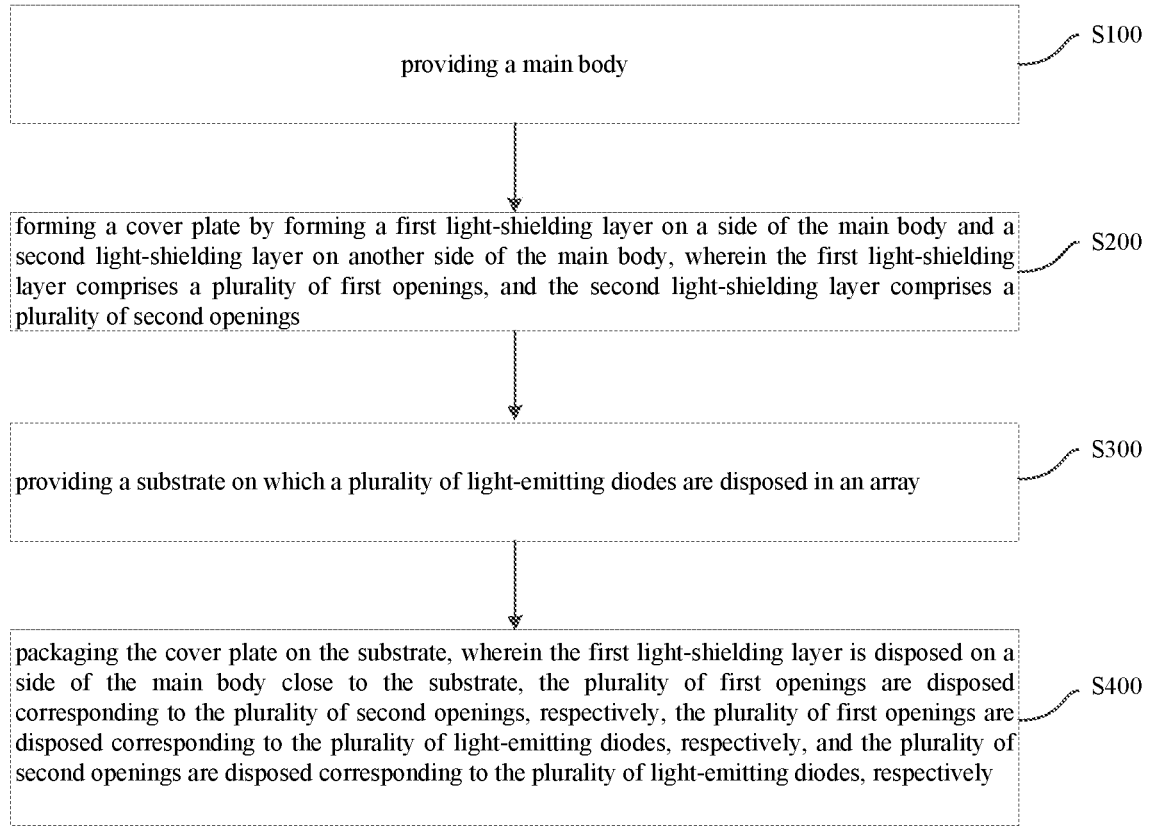
FIG. 6 is a schematic block diagram of a manufacturing method for display panel according to an embodiment of the present disclosure.
Figure 7:
FIG. 7 is a first process diagram of a manufacturing method for display panel according to an embodiment of the present disclosure.
Figure 8:
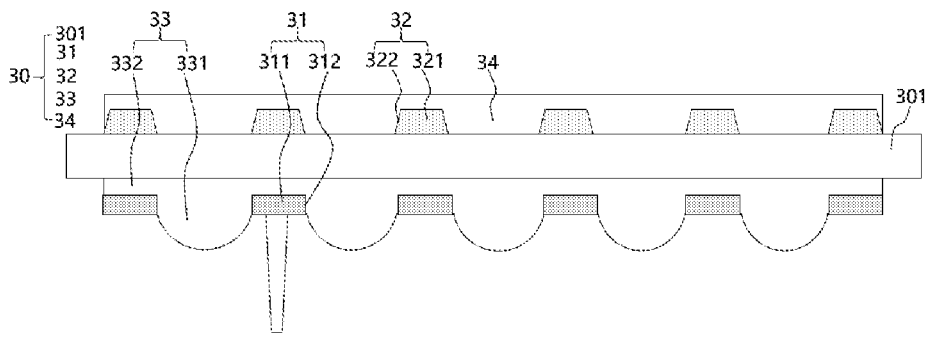
FIG. 8 is a second process diagram of a manufacturing method for display panel according to an embodiment of the present disclosure.

Referring to FIG. 6 to FIG. 10, FIG. 6 is a schematic block diagram of a manufacturing method for display panel according to an embodiment of the present disclosure; FIG. 7 is a first process diagram of a manufacturing method for display panel according to an embodiment of the present disclosure; FIG. 8 is a second process diagram of a manufacturing method for display panel according to an embodiment of the present disclosure; FIG. 9 is a third process diagram of a manufacturing method for display panel according to an embodiment of the present disclosure; and FIG. 10 is a schematic block diagram of another manufacturing method for display panel according to an embodiment of the present disclosure. The step numerals in FIG. 6 and FIG. 10 are merely for ease of explanation of the manufacturing method for the display panel, and do not constitute a limitation on the manufacturing sequence.

The present embodiment provides a manufacturing method for display panel. The display panel 1000 according to any one of the above embodiments may be manufactured by the manufacturing method. As shown in FIG. 6, the manufacturing method for display panel includes the steps S100, S200, S300, and S400.

Step S100: providing a main body.

Specifically, as shown in FIG. 7, a main body 301 is provided.

Step S200: forming a cover plate by forming a first light-shielding layer on a side of the main body and a second light-shielding layer on the other side of the main body, wherein the first light-shielding layer includes a plurality of first openings, and the second light-shielding layer includes a plurality of second openings.

Specifically, as shown in FIG. 8, a first light-shielding layer 31 is formed on a side of the main body 301, wherein the first light-shielding layer 31 includes a plurality of first openings 312. A second light-shielding layer 32 is formed on the other side of the main body 301, and the second light-shielding layer 32 includes a plurality of second openings 322. As such, a cover plate 30 is formed.

Step S300: providing a substrate on which a plurality of light-emitting diodes are disposed in an array.

Specifically, as shown in FIG. 9, a substrate 10 is provided, and a plurality of array-light-emitting diodes 20 are disposed in an array on the substrate 10.

Step S400: packaging the cover plate on the substrate, wherein the first light-shielding layer is disposed on a side of the main body close to the substrate, the first openings are disposed corresponding to the second openings, respectively; the first openings are disposed corresponding to the light-emitting diodes, respectively; and the second openings are disposed corresponding to the light-emitting diodes, respectively.

Specifically, as shown in FIGS. 3, 4, and 5, the cover plate is packaged on the substrate 10. The first light-shielding layer 31 is disposed on a side of the main body 301 close to the substrate 10. The first openings 312 are disposed corresponding to the second openings 322, respectively. The first openings 312 are disposed corresponding to the light-emitting diodes 20, respectively; and the second openings 322 are disposed corresponding to the light-emitting diodes 20, respectively.

In some embodiments, as shown in FIG. 10, the step S500 is further included before or after "forming the first light-shielding layer on a side of the main body".

Step S500: forming a condenser lens layer on the main body, wherein the condenser lens layer includes a plurality of condenser lenses, the condenser lenses are disposed in at least the first openings, and the condenser lenses are opposite to the light-emitting diodes after packaging the cover plate on the substrate.

Specifically, as shown in FIG. 8, before or after the "forming the first light-shielding layer 31 on a side of the main body 301", the method further includes the step S500 of forming a condenser lens layer 33 on the main body 301, wherein the condenser lens layer 33 includes a plurality of condenser lenses 331, the condenser lenses 331 are disposed in at least the first openings 312.

Specifically, as shown in FIGS. 3, 4, and 5, the condenser lenses 331 are opposite to the light-emitting diodes 20 after the cover plate 30 is packaged on the substrate 10.

In some embodiments, the condenser lens layer further includes a plurality of lens connectors formed on the main body. Each of the lens connectors connects the adjacent condenser lenses which correspond to two adjacent first openings. A height of the condenser lens from the main body is greater than a height of the lens connector from the main body. The condenser lens and the lens connector are formed by the same embossing process.

Specifically, as shown in FIGS. 3 and 4, the condenser lens layer 33 further includes a plurality of lens connectors 332 formed on the main body 301. Each of the lens connectors 332 connects adjacent condenser lenses 331, and wherein the adjacent condenser lenses 331 correspond to two adjacent first openings 312, respectively. A height of the condenser lens 331 from the main body 301 is greater than a height of the lens connector 332 from the main body 301. The condenser lens 331 and the lens connector 332 are formed by the same embossing process, so that the manufacturing process for the condenser lens layer 33 is simple.

Embodiment 8

This embodiment is similar to Embodiment 7, a manufacturing method for the display panel 1000 shown in FIG. 3 or Embodiment 3 is further explained, but the manufacturing method is not limited thereto.

Figure 12:
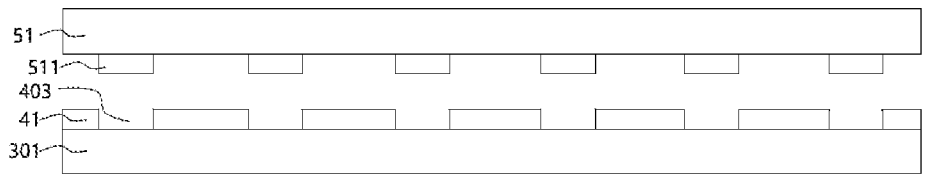
FIG. 12 is a second process diagram of a manufacturing method for display panel according to a third embodiment of the present disclosure.
Figure 13:
FIG. 13 is a third process diagram of a manufacturing method for display panel according to a third embodiment of the present disclosure.
Figure 14:
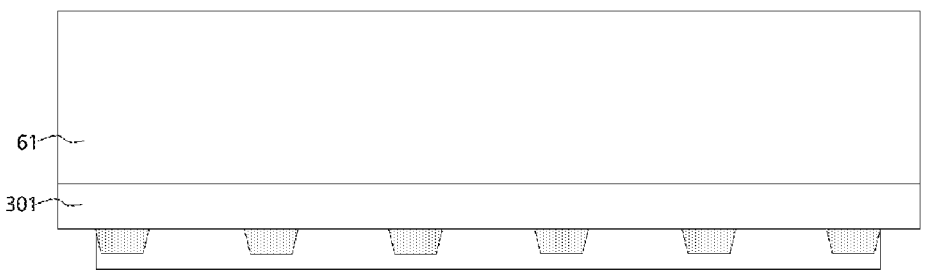
FIG. 14 is a fourth process diagram of a manufacturing method for display panel according to a third embodiment of the present disclosure.
Figure 15:
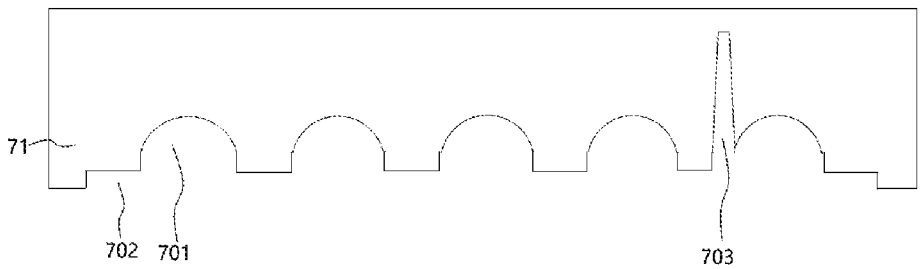
FIG. 15 is a fifth process diagram of a manufacturing method for display panel according to a third embodiment of the present disclosure.
Figure 16:
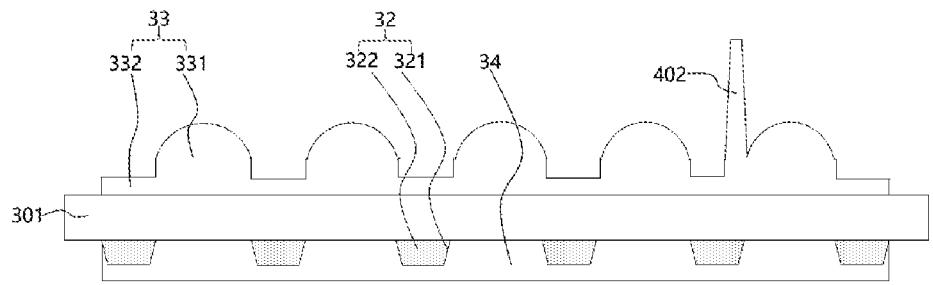
FIG. 16 is a sixth process diagram of a manufacturing method for display panel according to a third embodiment of the present disclosure.
Figure 17:
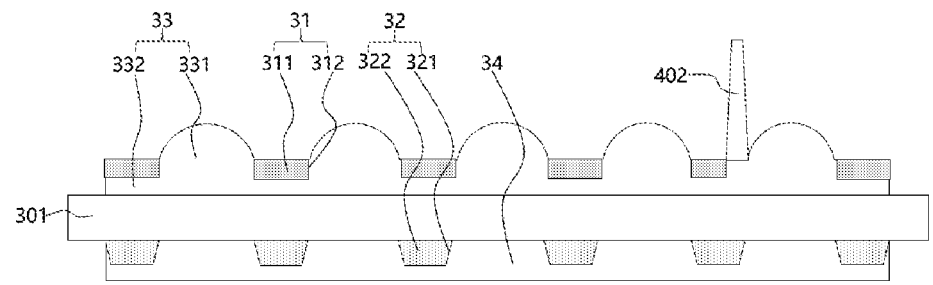
FIG. 17 is a seventh process diagram of a manufacturing method for display panel according to a third embodiment of the present disclosure.
Figure 18:
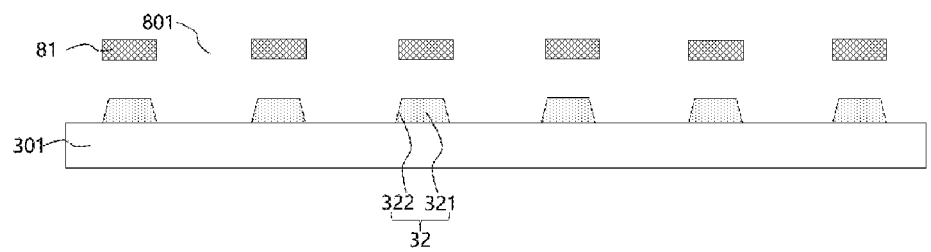
FIG. 18 is a first process diagram of a manufacturing method for display panel according to a fourth embodiment of the present disclosure.

Referring to FIG. 11 to FIG. 17, FIG. 11 is a first process diagram of a manufacturing method for display panel according to a third embodiment of the present disclosure; FIG. 12 is a second process diagram of a manufacturing method for display panel according to a third embodiment of the present disclosure; FIG. 13 is a third process diagram of a manufacturing method for display panel according to a third embodiment of the present disclosure; FIG. 14 is a fourth process diagram of a manufacturing method for display panel according to a third embodiment of the present disclosure; FIG. 15 is a fifth process diagram of a manufacturing method for display panel according to a third embodiment of the present disclosure; FIG. 16 is a sixth process diagram of a manufacturing method for display panel according to a third embodiment of the present disclosure; and FIG. 17 is a seventh process diagram of a manufacturing method for display panel according to a third embodiment of the present disclosure.

In this embodiment, the manufacturing method for the display panel 1000 according to Embodiment 3 or FIG. 3 is mainly described with reference to steps S200 and S500 in Embodiment 7.

In step S200, a method of forming the first light-shielding layer 31 on a side of the main body 301 includes: as shown in FIG. 11, forming a first light-shielding layer material 41 on the main body 301; as shown in FIG. 12, forming a first light-shielding layer presetting pattern by a first light-shielding layer embossing die 51 in an embossing process, wherein the first light-shielding layer embossing die 51 includes a die body, and a presetting projection 511 for forming a presetting opening 403 in the first light-shielding layer presetting pattern; and as shown in FIG. 13, forming the first light-shielding layer 31 by an ink jet printing process using a first light-shielding layer ink jet apparatus 52.

In steps S200 and S500, the method of forming the second light-shielding layer 32 on the other side of the main body 301 and forming the condenser lens layer 33 on the main body 301 includes: forming a condenser lens layer 33 firstly, and then forming a second light-shielding layer 32. The method of forming a condenser lens layer 33 firstly includes: as shown in FIG. 14, forming a condenser lens layer material 61 on the other side of the main body 301; as shown in FIG. 15 and FIG. 16, forming a condenser lens layer 33 in an embossing process by a condenser lens layer embossing die 71, wherein the condenser lens layer embossing die 71 includes a first pattern 701 corresponding to the condenser lens 331 and a second pattern 702 corresponding to the lens connector 332; as shown in FIG. 17, forming the second light-shielding layer 32 on the lens connector 332 by a process such as ink jet printing. It should be noted that the condenser lens layer embossing die 71 may also include a first pattern 701 corresponding to the condenser lens 331, a second pattern 702 corresponding to the lens connector 332, and a third pattern 703 corresponding to the support post 402. The condenser lens 331, the lens connector 332, and the support post 402 are formed simultaneously by the same embossing process, thereby simplifying the manufacturing process.

Embodiment 9

This embodiment is similar to Embodiment 7, a manufacturing method for the display panel 1000 shown in FIG. 4 or Embodiment 4 is further explained, but the manufacturing method is not limited thereto.

Figure 19:
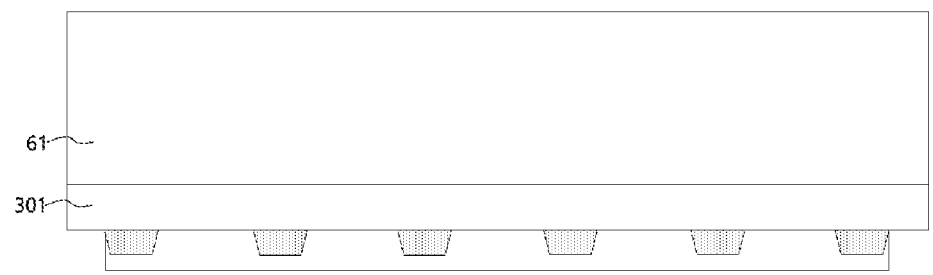
FIG. 19 is a second process diagram of a manufacturing method for display panel according to a fourth embodiment of the present disclosure.
Figure 20:
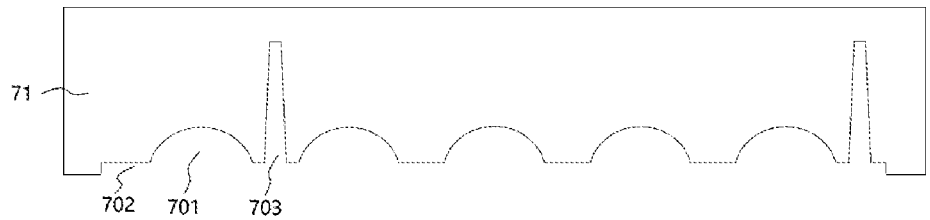
FIG. 20 is a third process diagram of a manufacturing method for display panel according to a fourth embodiment of the present disclosure.
Figure 21:
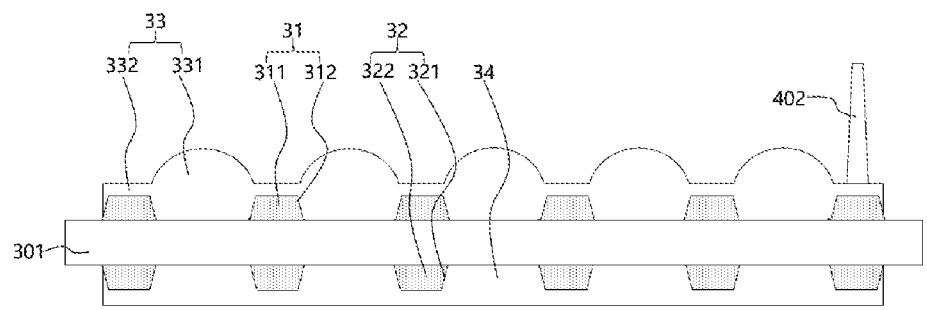
FIG. 21 is a fourth process diagram of a manufacturing method for display panel according to a fourth embodiment of the present disclosure.

Referring to FIG. 18 to FIG. 21, FIG. 18 is a first process diagram of a manufacturing method for display panel according to a fourth embodiment of the present disclosure; FIG. 19 is a second process diagram of a manufacturing method for display panel according to a fourth embodiment of the present disclosure; FIG. 20 is a third process diagram of a manufacturing method for display panel according to a fourth embodiment of the present disclosure; and FIG. 21 is a fourth process diagram of a manufacturing method for display panel according to a fourth embodiment of the present disclosure.

In this embodiment, the manufacturing method for the display panel 1000 according to Embodiment 4 or FIG. 4 is mainly described with reference to steps S200 and S500 in Embodiment 7.

In step S200, a method of forming the first light-shielding layer 31 on a side of the main body 301 includes: forming a first light-shielding layer 31 on the main body 301 by an etching process, wherein a mask 81 of the first light-shielding layer may be used in the etching process, and the mask 81 of the first light-shielding layer has a mask pattern 801 corresponding to the first light-shielding layer.

In steps S200 and S500, the method of forming the second light-shielding layer 32 on the other side of the main body 301 and forming the condenser lens layer 33 on the main body 301 includes: forming a second light-shielding layer 32 firstly, and then forming a condenser lens layer 33. The method of forming the second light-shielding layer 32 firstly includes an embossing process or an etching process, which is not limited herein. The method for then forming a condenser lens layer 33 comprises: as shown in FIG. 19, forming a condenser lens layer material 61 on the other side of the main body 301; as shown in FIGS. 20 and 21, forming a condenser lens layer 33 in an embossing process by a condenser lens layer embossing die 71, wherein the condenser lens layer embossing die 71 includes a first pattern 701 corresponding to the condenser lens 331 and a second pattern 702 corresponding to the lens connector 332. It should be noted that the condenser lens layer embossing die 71 may also include a first pattern 701 corresponding to the condenser lens 331, a second pattern 702 corresponding to the lens connector 332, and a third pattern 703 corresponding to the support post 402. The condenser lens 331, the lens connector 332, and the support post 402 are formed simultaneously by the same embossing process, thereby simplifying the manufacturing process.

Embodiment 10

This embodiment is similar to Embodiment 7, a manufacturing method for the display panel 1000 shown in FIG. 5 or Embodiment 5 is further explained, but the manufacturing method is not limited thereto.

Figure 22:
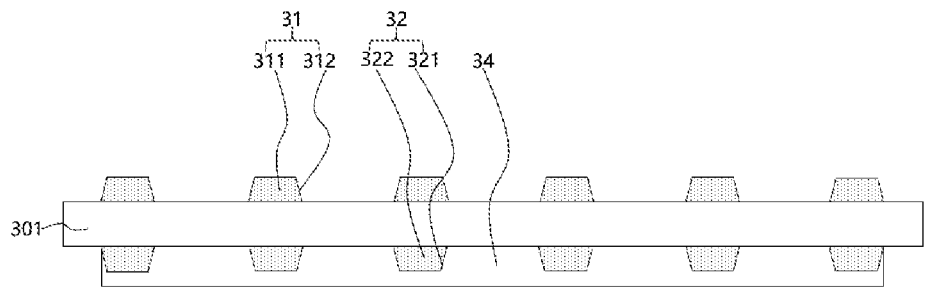
FIG. 22 is a first process diagram of a manufacturing method for display panel according to a fifth embodiment of the present disclosure.
Figure 23:
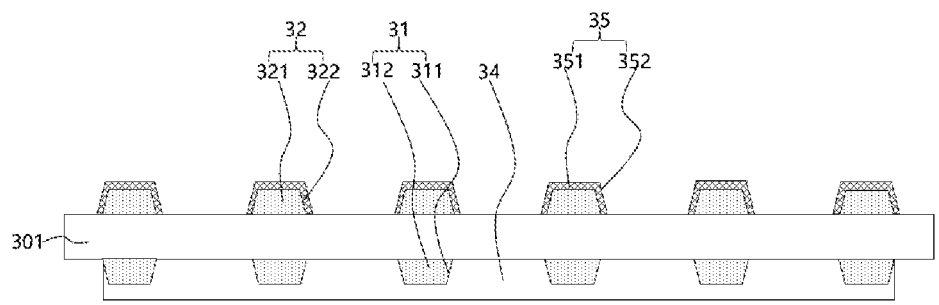
FIG. 23 is a second process diagram of a manufacturing method for display panel according to a fifth embodiment of the present disclosure.
Figure 24:
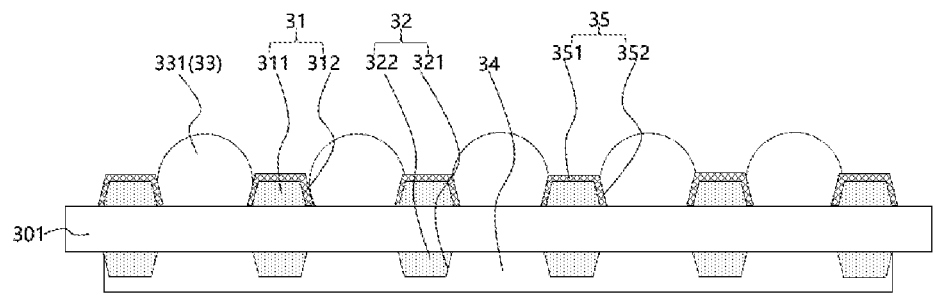
FIG. 24 is a third process diagram of a manufacturing method for display panel according to a fifth embodiment of the present disclosure.

Referring to FIG. 22 to FIG. 24, FIG. 22 is a first process diagram of a manufacturing method for display panel according to a fifth embodiment of the present disclosure; FIG. 23 is a second process diagram of a manufacturing method for display panel according to a fifth embodiment of the present disclosure; and FIG. 24 is a third process diagram of a manufacturing method for display panel according to a fifth embodiment of the present disclosure.

In this embodiment, the manufacturing method for the display panel 1000 according to Embodiment 5 or FIG. 5 is mainly described with reference to steps S200 and S500 in Embodiment 7.

In step S200, a method of forming the first light-shielding layer 31 on a side of the main body 301 includes an embossing process or an etching process, which is not limited herein.

In steps S200 and S500, the method of forming the second light-shielding layer 32 on the other side of the main body 301 and forming the condenser lens layer 33 on the main body 301 includes: forming a second light-shielding layer 32 firstly, and then forming a condenser lens layer 33. The method of forming a second light-shielding layer 32 firstly includes an embossing process or an etching process, as shown in FIG. 22, and is not limited herein. The method of then forming a condenser lens layer 33 includes: as shown in FIG. 23, forming a first film layer 35 on the second light-shielding layer 32, wherein the first film layer 35 may be formed by an etching process and the like, and the structure and characteristics refer to Embodiment 5. As shown in FIG. 24, the method of forming the condenser lens 331 may be inkjet printing, the material of the condenser lens 331 is inkjet printed in the fourth opening 352 of the first film layer 35, wherein the first film layer 35 is made of a hydrophobic material. The first film layer 35 covers the side wall of the first light-shielding members 311 at the portion of the first opening 312.

Figure 25:
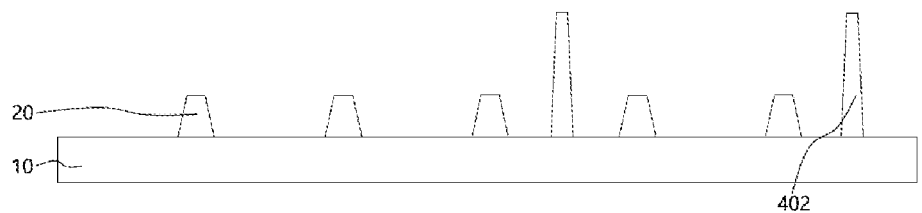
FIG. 25 is a schematic diagram of a substrate according to an embodiment of the present disclosure.

It should be noted that, in the display panel 1000 according to any one of the above embodiments, the support post 402 may be formed on the substrate 10, wherein references are made to FIG. 25 which is a schematic diagram of the substrate according to an embodiment of the present disclosure.

It should be noted that, as shown in FIGS. 3, 4 and 5, in the display panel 1000 according to any one of the above-described embodiments, a packaging adhesive or a sealant 401 may be provided between the cover plate 30 and the substrate 10 to seal or package the cover plate and the substrate 10.

Figure 26:
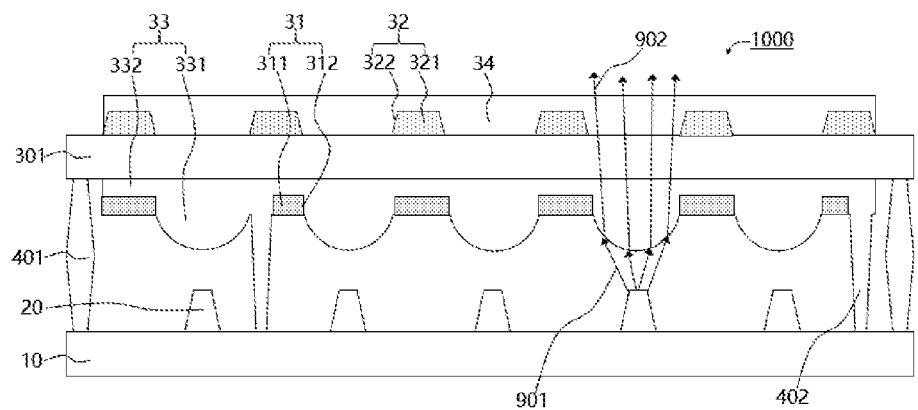
FIG. 26 is a schematic diagram of a light convergence effect of a condenser lens according to an embodiment of the present disclosure.
Figure 27:
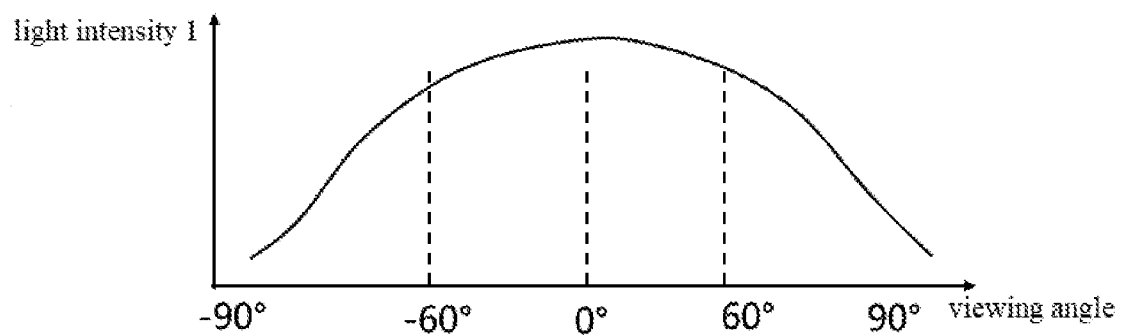
FIG. 27 is a schematic diagram of exit angles of first lights emitted by a light-emitting diode according to an embodiment of the present disclosure.
Figure 28:
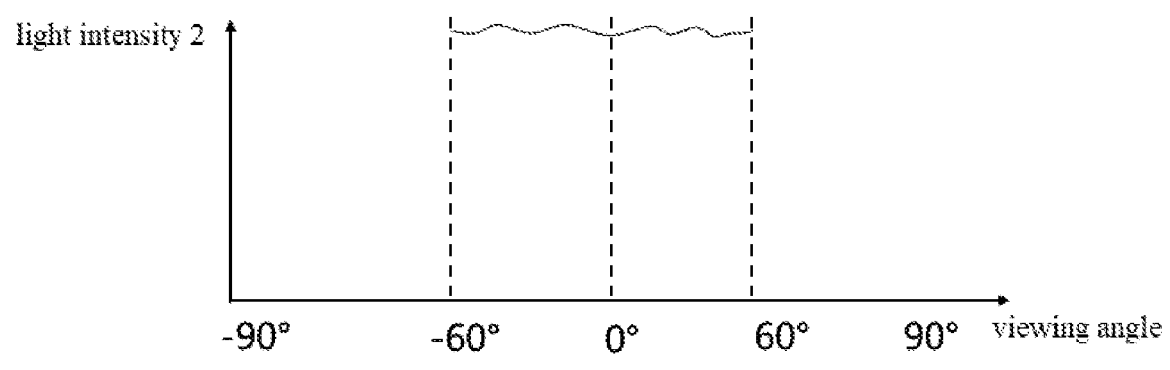
FIG. 28 is a schematic diagram of exit angles of second lights emitted after convergence by a condenser lens according to an embodiment of the present disclosure.

Referring to FIG. 26, FIG. 27 and FIG. 28, FIG. 26 is a schematic diagram of a light convergence effect of a condenser lens according to an embodiment of the present disclosure; FIG. 27 is a schematic diagram of exit angles of first lights emitted by a light-emitting diode according to an embodiment of the present disclosure; FIG. 28 is a schematic diagram of exit angles of second lights emitted after convergence by a condenser lens according to an embodiment of the present disclosure. As shown in FIG. 26, the light-emitting diode 20 emits the first lights 901 at different exit angles, causing different viewing angles of the first lights 901. As shown in FIG. 26, the condenser lens converges the first lights 901 to emit the second lights 902 at exit angles in a small range, reducing the lights emitted at a large-viewing angle. For example, the lights emitted over 60 degrees which is a large-viewing angle are reduced. FIG. 27 shows different viewing angles correspond to different light intensity 1 of the first lights 901, and FIG. 28 shows different viewing angles correspond to different light intensity 2 of the first lights 902. From FIG. 27 and FIG. 28, light intensity in a preset range of viewing angles is increased.

The display panel and the manufacturing method for display panel provided in the embodiments of the present disclosure are described in detail above. The principles and implementation of the present disclosure are described herein by applying specific examples. The description of the above embodiments is only used to help understand the method and the core idea of the present disclosure. At the same time, for those skilled in the art, according to the idea of the present disclosure, there will be some changes in specific embodiments and disclosure scope. In conclusion, the contents of the present specification shall not be construed as limiting the present disclosure.

What is claimed is:

1. A display panel, comprising:
   a substrate;
   a plurality of light-emitting diodes disposed on the substrate in an array; and
   a cover plate disposed on a side of each of the plurality of light-emitting diodes away from the substrate;
   wherein the cover plate comprises a main body, a first light-shielding layer disposed on a side of the main body close to the substrate, and a second light-shielding layer disposed on a side of the main body away from the substrate; wherein the first light-shielding layer includes a plurality of first openings, the second light-shielding layer includes a plurality of second openings; wherein the plurality of first openings are disposed corresponding to the plurality of second openings, respectively, the plurality of first openings are disposed corresponding to the plurality of light-emitting diodes, respectively, and the plurality of second openings are disposed corresponding to the plurality of light-emitting diodes, respectively;
   wherein the cover plate further comprises:
   a condenser lens layer disposed on the side of the main body close to the substrate, wherein the condenser lens layer comprises a plurality of condenser lenses disposed within the plurality of first openings, and the plurality of condenser lenses are opposite to the plurality of light-emitting diodes.

2. The display panel of claim 1, wherein the condenser lens layer further comprises a plurality of lens connectors disposed on the main body, each of the plurality of lens connectors connects adjacent condenser lenses of the plurality of condenser lenses, and a height of each of the plurality of condenser lenses from the main body is greater than a height of the lens connector from the main body.

3. The display panel of claim 2, wherein the condenser lens and the lens connector are integrally formed.

4. The display panel of claim 3, further comprising a support post disposed between the cover plate and the substrate, wherein the condenser lens layer and the support post are integrally formed.

5. The display panel of claim 2, wherein the first light-shielding layer is disposed on a surface of the lens connector close to the substrate and between the adjacent condenser lenses.

6. The display panel of claim 5, further comprising a support post disposed between the cover plate and the substrate, wherein the condenser lens layer and the support post are integrally formed.

7. The display panel of claim 2, wherein the first light-shielding layer is disposed on a surface of the lens connector away from the substrate.

8. The display panel of claim 7, further comprising a support post disposed between the cover plate and the substrate, wherein the condenser lens layer and the support post are integrally formed.

9. The display panel of claim 2, wherein the cover plate further comprises:
   a first protective layer disposed on a side of the main body away from the substrate, wherein the first protective layer covers a surface of the second light-shielding layer away from the substrate.

10. The display panel of claim 2, further comprising a support post disposed between the cover plate and the substrate, wherein the condenser lens layer and the support post are integrally formed.

11. The display panel of claim 1, wherein the cover plate further comprises a first film layer which is made of a hydrophobic material, the first film layer is disposed on a surface of the first light-shielding layer close to the substrate, wherein the first film layer comprises a plurality of fourth openings corresponding to the plurality of first openings, respectively, an orthographic projection of the first film layer on the main body covers an orthographic projection of the first light-shielding layer on the main body, and the plurality of condenser lens are disposed in the plurality of fourth openings.

12. The display panel of claim 1, wherein the cover plate further comprises:
    a first protective layer disposed on a side of the main body away from the substrate, wherein the first protective layer covers a surface of the second light-shielding layer away from the substrate.

13. The display panel of claim 1, wherein the cover plate further comprises:
    a first protective layer disposed on a side of the main body away from the substrate, wherein the first protective layer covers a surface of the second light-shielding layer away from the substrate.

14. The display panel of claim 1, further comprising a support post disposed between the cover plate and the substrate.

15. The display panel of claim 1, wherein an orthographic projection of each of the plurality of first openings on the substrate overlaps with an orthographic projection of a respective one of the plurality of second openings on the substrate.

16. A manufacturing method for display panel, comprising:
    providing a main body;
    forming a cover plate by forming a first light-shielding layer on a side of the main body and a second light-shielding layer on another side of the main body, wherein the first light-shielding layer comprises a plurality of first openings, and the second light-shielding layer comprises a plurality of second openings;
    providing a substrate on which a plurality of light-emitting diodes are disposed in an array; and
    packaging the cover plate on the substrate, wherein the first light-shielding layer is disposed on a side of the main body close to the substrate, the plurality of first openings are disposed corresponding to the plurality of second openings, respectively, the plurality of first openings are disposed corresponding to the plurality of light-emitting diodes, respectively, and the plurality of second openings are disposed corresponding to the plurality of light-emitting diodes, respectively;
    before or after forming the first light-shielding layer on the side of the main body, the method comprises:

forming a condenser lens layer on the main body, wherein the condenser lens layer includes a plurality of condenser lenses, the condenser lenses are disposed at least in the plurality of first openings; and the plurality of condenser lenses are opposite to the plurality of light-emitting diodes after packaging the cover plate on the substrate;

wherein the condenser lens layer further comprises a plurality of lens connectors disposed on the main body, each of the plurality of lens connectors connects adjacent condenser lenses of the plurality of condenser lenses, a height of each of the plurality of condenser lenses from the main body is greater than a height of the lens connector from the main body; and the condenser lens and the lens connector are formed by a same embossing process.

* * * * *